(12) United States Patent
Koh

(10) Patent No.: US 6,391,722 B1
(45) Date of Patent: May 21, 2002

(54) METHOD OF MAKING NONVOLATILE MEMORY HAVING HIGH CAPACITIVE COUPLING RATIO

(75) Inventor: Chao-Ming Koh, Hsinchu Hsien (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/903,695

(22) Filed: Jul. 13, 2001

(51) Int. Cl.⁷ .......................................... H01L 21/8247
(52) U.S. Cl. ...................... 438/264; 438/296; 438/594
(58) Field of Search ............................... 438/259, 261, 438/264, 296, 424, 594, 657

(56) References Cited

U.S. PATENT DOCUMENTS 6,140,182 A * 10/2000 Chen ........................... 438/296
6,153,494 A * 11/2000 Hsieh et al. ................. 438/296
6,171,909 B1 * 1/2001 Ding et al. ................... 438/264
6,228,713 B1 * 5/2001 Pradeep et al. .............. 438/296

* cited by examiner

Primary Examiner—Chandra Chaudhari
(74) Attorney, Agent, or Firm—Intellectual Property Solutions, P.L.L.C.

(57) ABSTRACT

A method of making a nonvolatile memory device having a high capacitive coupling ratio with a self-aligned floating gate is disclosed. A tunnel dielectric layer, a first conductive layer, and a sacrificial layer are sequentially formed over a semiconductor substrate. Isolation trenches are etched in the substrate through the layers and filled with isolation oxides that protrude over the substrate. Subsequently, the sacrificial layer is removed to leave a cavity between the isolation oxides. A second conductive layer is conformally deposited over substrate, and then planarized or etched back to the isolation oxides. Next, the isolation oxides are etched back to expose additional surface of the second conductive layer. Finally, an inter-gate dielectric layer and a control gate layer are sequentially formed over the substrate.

21 Claims, 3 Drawing Sheets

METHOD OF MAKING NONVOLATILE MEMORY HAVING HIGH CAPACITIVE COUPLING RATIO

BACKGROUND OF THE INVENTION

1. Field of the Invention

The present invention generally relates to a nonvolatile semiconductor memory device such as an EPROM (erasable programmable read only memory), EEPROM (electrically erasable programmable read only memory) and a flash memory. More particularly, it relates to a method of making a nonvolatile memory device having a high capacitive coupling ratio.

2. Description of the Related Arts

High-density nonvolatile memory devices have been receiving much attention for application in many fields. One of the most important factors is the low cost of the reduced size of each memory cell. However, it is very difficult to shrink the cell size in the fabrication of nonvolatile memory cells when the conventional local oxidation (LOCOS) isolation technique is used. The isolation structure formed by this technique has a very large dimension and thus limits the miniaturization of the memory cells.

Another isolation technique called shallow trench isolation (STI) has been introduced to the fabrication of nonvolatile memory devices to reduce the cell size. The conventional field oxides are replaced by STI structures so that the device integration can be effectively improved. However, as component dimensions continue to shrink, the surface area of floating gates also shrinks. This leads directly to a decrease in capacitance of the effective capacitor formed between the floating gate layer and the control gate layer. This decrease in effective capacitance results in a reduction of the capacitive coupling ratio, which is a parameter that describes the coupling to floating gate of the voltage applied to control gate. The poorly-coupled voltage to floating gate limits the programming and accessing speed characteristics of the memory device.

The capacitive coupling ratio Cp is defined by:

$$Cp = \frac{Ccf}{Ccf + Cfs}$$

where Ccf is capacitance between the control gate and the floating gate; and Cfs is capacitance between the floating gate and the semiconductor substrate.

In order to gain programming and accessing speeds in nonvolatile memories, many attempts have been done to increase the coupling ratio. It can be understood from the above equation that when the capacitance Ccf between the control gate and the floating gate increases, the coupling ratio Cp increases. Therefore, the coupling ratio Cp is generally increased by increasing the capacitor area between the floating gate and control gate, which increases the capacitance Ccf, and therefore the coupling ratio Cp.

U.S. Pat. No. 6,153,494 discloses a method to increase the coupling ratio by lateral coupling in stacked-gate flash memory cell. High-step oxides are formed protruding over the shallow trench isolation (STI). A polysilicon layer for serving as a floating gate layer is conformally deposited so as to follow the contours of an opening between the high-step oxides, thus providing addition surface to the control gate and increasing the coupling ratio. However in this method, the floating gate is not formed in a self-aligned manner. It requires an additional lithography and etching process to define the floating gate from the polysilicon layer, which inevitably incurs more cost and decreases the throughput, and possibly creates alignment errors.

Therefore, it would represent a significant advancement in the state of the art if the capacitive coupling ratio can be increased by forming a self-aligned floating gate.

SUMMARY OF THE INVENTION

An object of the invention is to provide a method of making a nonvolatile memory having a high capacitive coupling ratio.

Another object of the invention is to provide a method of making a nonvolatile memory having a self-aligned floating gate.

The above objects are accomplished by providing method of making a nonvolatile memory, comprising the steps of: sequentially forming a tunnel dielectric layer and a first conductive layer over a semiconductor substrate; forming a sacrificial layer over the first conductive layer; patterning the sacrificial layer, the first conductive layer, the tunnel dielectric layer, and the substrate to form trenches in the substrate; filling the trenches with isolation oxides that protrude over the substrate; removing the sacrificial layer thereby leaving a cavity between the isolation oxides; forming a second conductive layer conformally over the isolation oxides and along the sidewalls and bottom of the cavity; removing portions of the second conductive layer over the isolation oxides, wherein the remaining portions of the second conductive layer and the first conductive layer together serve as a floating gate layer; etching back the isolation oxides to expose additional surface of the second conductive layer; and sequentially forming an inter-gate dielectric layer and a control gate layer over the substrate.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENTS

Now in keeping with the objective of this invention, the method for fabricating a nonvolatile memory is described in detail.

Figure 1:
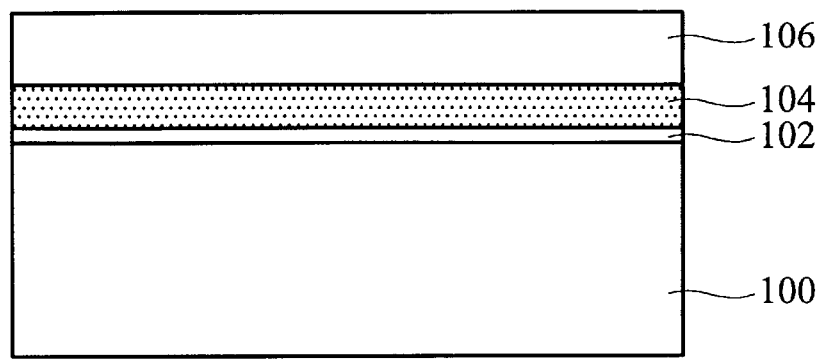
FIGS. 1 through 7 are cross-sectional views illustrating the steps for making a nonvolatile memory device according to a preferred embodiment of the invention.

Referring to FIG. 1, on a surface of a semiconductor substrate 100, a tunnel dielectric layer 102, a first conductive layer 104, and a sacrificial layer 106 are sequentially formed. The tunnel dielectric layer 102 is typically a silicon oxide layer 102 having a thickness between about 70 to 100 Å. It can be formed by a thermal oxidation process at a temperature between about 750° C. to 950° C. Alternatively, the tunnel dielectric layer can be formed by an atmospheric or low pressure chemical vapor deposition (LPCVD) process as is well known.

The first conductive layer 104 over the tunnel dielectric layer 102 is typically made of doped polysilicon, and preferably in-situ doped polysilicon. The first conductive layer 104 is formed through methods including but not limited to Chemical Vapor Deposition (CVD) methods employing suitable silicon source materials, and preferably formed through a LPCVD method employing silane ($SiH_4$) as a silicon source material at a temperature range between about 530° C. to 650° C. This first conductive layer 104 preferably has a thickness between about 1000 Å and 3000 Å.

The sacrificial layer 106 over the first conductive layer 104 preferably has a thickness between about 1000 Å and 3000 Å. It will be apparent later that the sacrificial layer is used to provide a "RAISED" insulator filler that protruding over the substrate. A particularly preferred material for the sacrificial layer 106 is silicon nitride, which is usually formed by reacting dichlorosilane ($SiCl_2H_2$) with ammonia ($NH_3$) through an LPCVD process. The sacrificial layer also serves as a polishing stop layer as will become apparent below.

Figure 2:
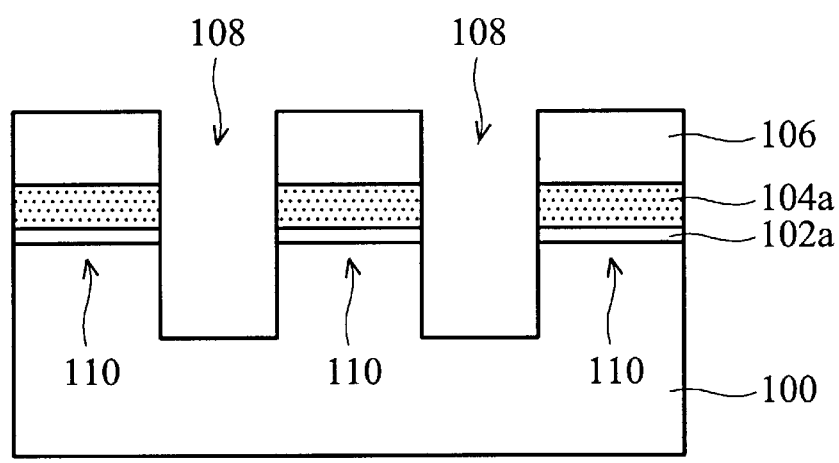

Referring to FIG. 2, the sacrificial layer 106, the first conductive layer 104, and the tunnel dielectric layer are then dry etched using a photoresist pattern as an etching mask which protects all areas on which active devices will later be formed. The etching is further carried into the substrate 100 to form shallow trenches 108 separating active regions 110. A tunnel dielectric 102a and a patterned first conductive layer 104a are also defined on the active regions 110. The patterned first conductive layer 104a will serve as a portion of the floating gate.

Figure 3:
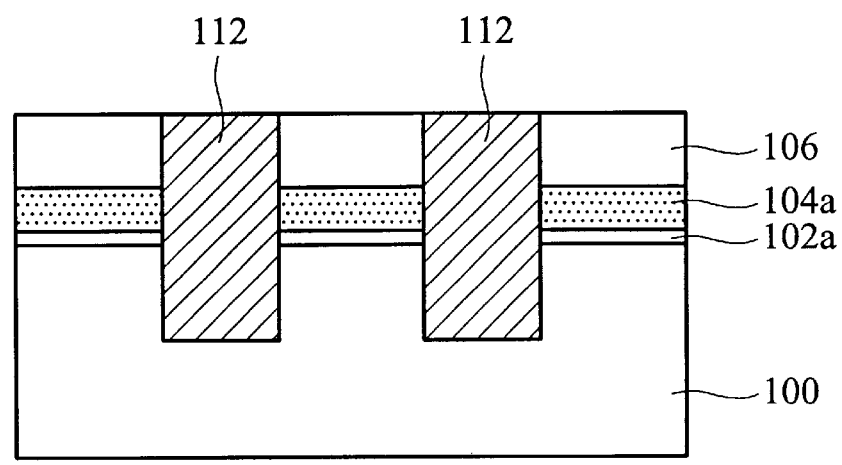

The photoresist pattern is removed, and then the inside walls of the trenches 108 are lined with an oxide layer (not shown) by thermal growth. Subsequently, the trenches 108 are filled with isolation oxide using the method of high density plasma (HDP) deposition or LPCVD. The excess oxide outside of the trenches 108 is removed by etch back or by chemical mechanical polishing (CMP) using the sacrificial layer 106 as a polishing stop layer, thus forming "RAISED" shallow trench isolation (STI) 112 as shown in FIG. 3.

Figure 4:
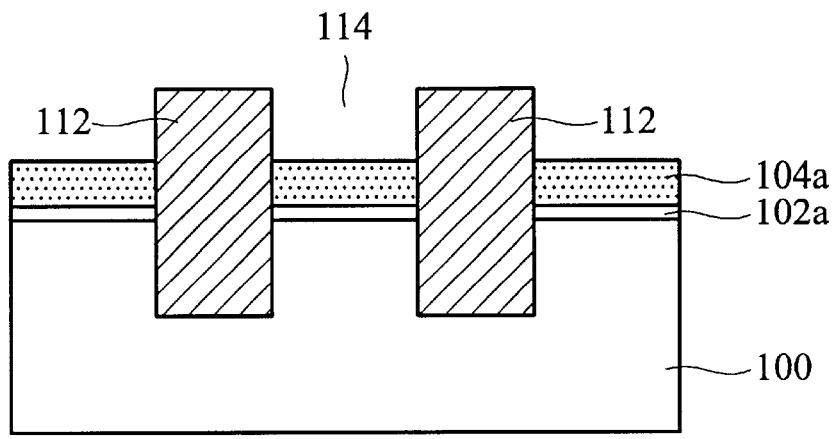

Subsequently, the sacrificial layer 106 is removed from the substrate, thus leaving a cavity 114 as shown in FIG. 4. The cavity 114 is located in between the isolation oxides 112 that protrude over the substrate 100. The sacrificial layer 106 is preferably removed by wet etch. When the sacrificial layer 106 is made of silicon nitride, it can be removed using phosphoric acid ($H_3PO_4$). The removal of the sacrificial layer also exposes the first conductive layer 104a, upon which a second conductive layer will be formed.

Figure 5:
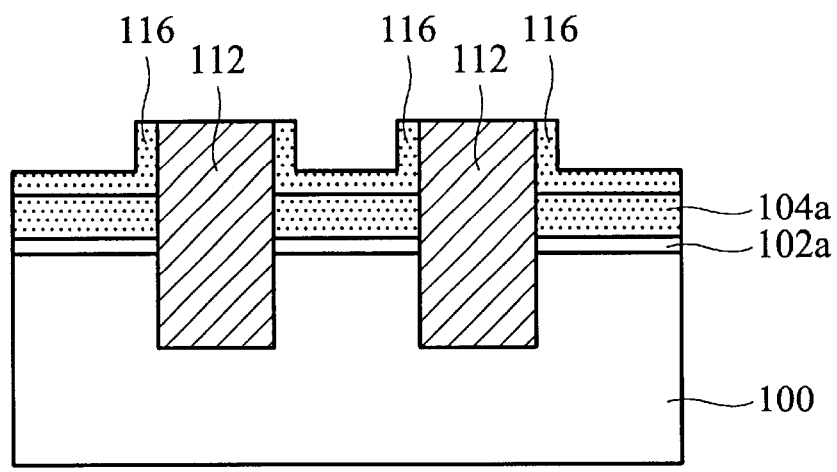

Subsequently, a second conductive layer 116 is deposited conformally over the isolation oxide 112 and along the sidewalls and bottom of the cavity. In other words, the second conductive layer 116 does not completely fill the cavity 114, and preferably is deposited to a thickness between about 100 Å and 1000 Å. The second conductive layer 116 is preferably made of doped polysilicon, and more preferably in-situ doped polysilicon. This is accomplished preferably through a LPCVD method employing silane ($SiH_4$) as a silicon source material at a temperature range between about 530° C. to 650° C. Next, the second conductive layer 116 is then planarized by chemical mechanical polishing (CMP) to the surface of the isolation oxide 112, thus leaving the second conductive layer 116 on the sidewalls and bottom of the cavity 114, as shown in FIG. 5. Alternatively, the undesired portions of the second conductive layer 116 can be removed through a plasma etch back process, which leaves conductive spacers on the sidewalls of the cavity 114. In each case, the second conductive layer 116 is left behind within the cavity 114 in a self-aligned manner and serves as a floating gate together with the underlying first conductive layer 104a. This obviates the need for an additional lithography process to define the floating gate. The second conductive layer 116 provides additional surface to the control gate that is to be formed later, and therefore increases the capacitive coupling ratio.

Figure 6:
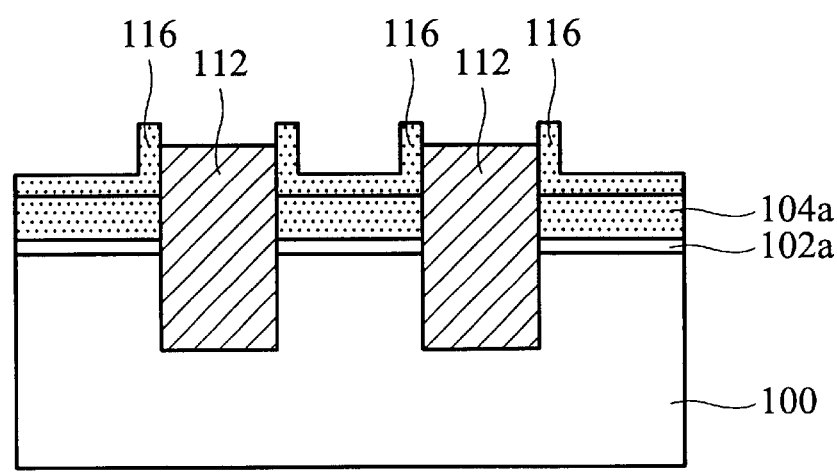

Referring to FIG. 6, as another key aspect of the invention, the isolation oxides 112 are recessed below the top surface of the second conductive layer 116 by etch back. As a result, additional lateral surface of the second conductive layer 116 is exposed, and the capacitive coupling ratio is further increased. In this embodiment, the isolation oxides 112 are etched back to a surface level between a top surface of the second conductive layer 116 and a bottom surface of the second conductive layer 116, as shown in FIG. 6.

Figure 7:
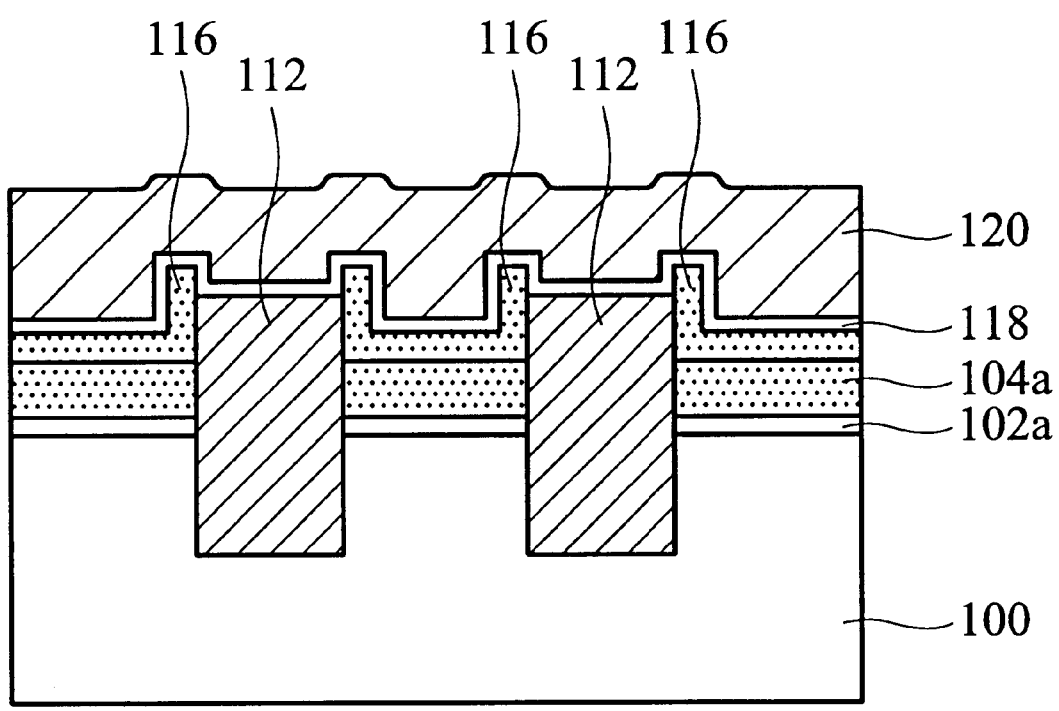

Next, as shown in FIG. 7, a thin inter-gate dielectric layer 118 and a third conductive layer 120 for serving as a control gate layer are sequentially formed over substrate surface. The inter-gate dielectric layer 118 is typically composed of oxide/nitride/oxide (ONO), nitride/oxide (NO), or $Ta_2O_5$. The third conductive layer 120 is typically made of doped polysilicon or polycide. Finally, a masking and etching process is performed to define a control gate from the third conductive layer 120. Thus, a nonvolatile memory device with a high capacitive coupling ratio and a self-aligned floating gate is formed.

In view of the foregoing, it is readily appreciated that the present invention provides a simple method to increase the coupling ratio with a self-aligned floating gate which eliminates the need for an additional lithography process. The capacitive coupling ratio is increased by the additional coupling between the control gate and the floating gate due to the additional lateral area provided by the second conductive layer 112. The second conductive layer, which serves as a portion of the floating gate, is formed in a self-aligned manner without an additional lithography process. By way of self-alignment, the present invention may reduce alignment errors and provide better reliability.

While the invention has been particularly shown and described with reference to the preferred embodiment thereof, it will be understood by those skilled in the art that various changes in form and details may be made without departing from the spirit and scope of the invention.

What is claimed is:

1. A method of making a nonvolatile memory, comprising the steps of:

sequentially forming a tunnel dielectric layer and a first conductive layer over a semiconductor substrate;

forming a sacrificial layer over said first conductive layer;

patterning said sacrificial layer, said first conductive layer, said tunnel dielectric layer, and said substrate to form trenches in said substrate;

filling said trenches with isolation oxides that protrude over the substrate;

removing said sacrificial layer thereby leaving a cavity between said isolation oxides;

forming a second conductive layer conformally over the insolation oxides and along the sidewalls and bottom of said cavity;

removing portions of said second conductive layer over the isolation oxides, wherein the remaining portions of said second conductive layer and said first conductive layer together serve as a floating gate layer;

etching back said isolation oxides to expose additional surface of said second conductive layer; and sequentially forming an inter-gate dielectric layer and a control gate layer over said substrate.

2. The method as claimed in claim 1, wherein said tunnel dielectric layer is a thermal oxide layer.

3. The method as claimed in claim 1, wherein said first conductive layer is a doped polysilicon layer.

4. The method as claimed in claim 1, wherein said sacrificial layer is a silicon nitride layer.

5. The method as claimed in claim 1, wherein said second conductive layer is a doped polysilicon layer.

6. The method as claimed in claim 1, wherein said second conductive layer has a thickness between about 100 Å and 1000 Å.

7. The method as claimed in claim 1, wherein the step of removing portions of said second conductive layer over the isolation oxides is accomplished by chemical mechanical polishing.

8. The method as claimed in claim 1, wherein the step of removing portions of said second conductive layer over the isolation oxides is accomplished by a plasma etch.

9. The method as claimed in claim 1, wherein said isolation oxides are etched back to a surface level between a top surface of said second conductive layer and a bottom surface of said second conductive layer.

10. A method of making a nonvolatile memory, comprising the steps of:
    sequentially forming a tunnel dielectric layer and a first conductive layer over a semiconductor substrate;
    forming a sacrificial layer over said first conductive layer;
    patterning said sacrificial layer, said first conductive layer, said tunnel dielectric layer, and said substrate to form trenches in said substrate;
    filling said trenches with isolation oxides that protrude over the substrate;
    removing said sacrificial layer thereby leaving a cavity between said isolation oxides;
    forming a second conductive layer conformally over said isolation oxides and along the sidewalls and bottom of said cavity;
    planarizing said second conductive layer to a surface of said isolation oxides thereby leaving the remaining portions of the second conductive layer on the sidewalls and bottoms of said cavity, wherein said first conductive layer and the remaining portions of said second conductive layer together serve as a floating gate layer;
    etching back said isolation oxides to a surface level between a top surface of said second conductive layer and a bottom surface of said second conductive layer; and
    sequentially forming an inter-gate dielectric layer and a control gate layer over said substrate.

11. The method as claimed in claim 10, wherein said tunnel dielectric layer is a thermal oxide layer.

12. The method as claimed in claim 10, wherein said first conductive layer is a doped polysilicon layer.

13. The method as claimed in claim 10, wherein said sacrificial layer is a silicon nitride layer.

14. The method as claimed in claim 10, wherein said second conductive layer is a doped polysilicon layer.

15. The method as claimed in claim 10, wherein said second conductive layer has a thickness between about 100 Å and 1000 Å.

16. A method of making a nonvolatile memory, comprising the steps of:
    sequentially forming a tunnel dielectric layer and a first conductive layer over a semiconductor substrate;
    forming a sacrificial layer over said first conductive layer;
    patterning said sacrificial layer, said first conductive layer, said tunnel dielectric layer, and said substrate to form trenches in said substrate;
    filling said trenches with isolation oxides that protrude over the substrate;
    removing said sacrificial layer thereby leaving a cavity between said isolation oxides;
    forming a second conductive layer conformally over said isolation oxides and along the sidewalls and bottom of said cavity;
    etching back said second conductive layer to a surface of said isolation oxides thereby leaving the remaining portions of the second conductive layer on the sidewalls of said cavity, wherein said first conductive layer and the remaining portions of said second conductive layer together serve as a floating gate layer;
    etching back said isolation oxides to a surface level between a top surface of said second conductive layer and a bottom surface of said second conductive layer; and
    sequentially forming an inter-gate dielectric layer and a control gate layer over said substrate.

17. The method as claimed in claim 16, wherein said tunnel dielectric layer is a thermal oxide layer.

18. The method as claimed in claim 16, wherein said first conductive layer is a doped polysilicon layer.

19. The method as claimed in claim 16, wherein said sacrificial layer is a silicon nitride layer.

20. The method as claimed in claim 16, wherein said second conductive layer is a doped polysilicon layer.

21. The method as claimed in claim 16, wherein said second conductive layer has thickness between about 100 Å and 1000 Å.

* * * * *